United States Patent

Storck et al.

(10) Patent No.: US 8,115,195 B2
(45) Date of Patent: Feb. 14, 2012

(54) SEMICONDUCTOR WAFER WITH A HETEROEPITAXIAL LAYER AND A METHOD FOR PRODUCING THE WAFER

(75) Inventors: Peter Storck, Burghausen (DE); Martin Vorderwestner, Unterreit (DE)

(73) Assignee: Siltronic AG, Munich (DE)

( * ) Notice: Subject to any disclaimer, the term of this patent is extended or adjusted under 35 U.S.C. 154(b) by 247 days.

(21) Appl. No.: 12/406,258

(22) Filed: Mar. 18, 2009

(65) Prior Publication Data

US 2009/0236696 A1 Sep. 24, 2009

Related U.S. Application Data

(63) Continuation-in-part of application No. 12/393,143, filed on Feb. 26, 2009, now abandoned.

(60) Provisional application No. 61/039,137, filed on Mar. 25, 2008.

(30) Foreign Application Priority Data

Mar. 20, 2008 (EP) ..................................... 08005334

(51) Int. Cl.
*H01L 21/02* (2006.01)
(52) U.S. Cl. ................... 257/19; 257/616; 257/E21.092
(58) Field of Classification Search ........................ None
See application file for complete search history.

(56) References Cited

U.S. PATENT DOCUMENTS

| | | | | |
|---|---|---|---|---|
| 6,876,010 B1 * | 4/2005 | Fitzgerald | ...................... | 257/191 |
| 7,214,598 B2 * | 5/2007 | Capewell et al. | .............. | 438/478 |
| 7,250,359 B2 * | 7/2007 | Fitzgerald | ...................... | 438/494 |
| 7,727,785 B2 * | 6/2010 | Connell et al. | .................... | 438/24 |
| 2004/0072409 A1 * | 4/2004 | Fitzgerald et al. | ............. | 438/455 |
| 2009/0087961 A1 * | 4/2009 | Hartmann et al. | ............. | 438/457 |
| 2010/0291761 A1 * | 11/2010 | Storck et al. | .................. | 438/493 |

FOREIGN PATENT DOCUMENTS

| | | |
|---|---|---|
| CN | 1656603 A2 | 8/2005 |
| EP | 2 043 135 A1 | 4/2009 |
| JP | 2003113000 A | 4/2003 |
| WO | 03/103031 A2 | 11/2003 |

* cited by examiner

*Primary Examiner* — Benjamin Sandvik
(74) *Attorney, Agent, or Firm* — Brooks Kushman P.C.

(57) ABSTRACT

A multilayer semiconductor wafer has a substrate wafer having a first side and a second side; a fully or partially relaxed heteroepitaxial layer deposited on the first side of the substrate wafer; and a stress compensating layer deposited on the second side of the substrate wafer. The multilayer semiconductor wafer is produced by a method including depositing on a first side of a substrate a fully or partially relaxed heteroepitaxial layer at a deposition temperature; and at the same temperature or before significantly cooling the wafer from the deposition temperature, providing a stress compensating layer on a second side of the substrate.

2 Claims, 1 Drawing Sheet

SEMICONDUCTOR WAFER WITH A HETEROEPITAXIAL LAYER AND A METHOD FOR PRODUCING THE WAFER

CROSS-REFERENCE TO RELATED APPLICATIONS

This application claims the benefit of U.S. provisional application Ser. No. 61/039,137, filed Mar. 25, 2008 and U.S. application Ser. No. 12/393,143, filed Feb. 26, 2009 and claims priority to European patent application EP08005334 filed Mar. 20, 2008, all of which are herein incorporated by reference.

BACKGROUND OF THE INVENTION

1. Field of the Invention

The invention is directed to single crystal substrates having a heteroepitaxial layer deposited thereon, and to a process for producing wafers having an epitaxially deposited heteroepitaxial layer thereon.

2. Description of the Related Art

A crystalline heteroepitaxial layer deposited on a single crystal substrate by epitaxial deposition typically differs from the substrate in several material properties including crystal lattice dimensions and thermal expansion coefficient. During the early stages of the deposition the heteroepitaxial layer is strained with respect to the underlying substrate lattice. After exceeding a certain layer thickness (critical thickness), the crystal of the heteroepitaxial layer starts to relax via the insertion of so called misfit dislocations (MFD). Although oriented in a plane perpendicular to the growth direction, not all MFD extend to the edge of the substrate wafer, but rather a certain number bend and form threading dislocations (TD) propagating through the growing layer to the surface. TD forming clusters along lines are called pile-ups (Pu) and are especially harmful for electronic devices. The stress fields from the dislocation network also cause a surface roughening called cross-hatch. The formation of MFD, Pu, TD, cross-hatch and a bending of the wafer (bow, warp) are mechanisms by which the strain from the lattice mismatch is relieved.

Many epitaxial deposition techniques have been developed to reduce the negative effects of the strain relaxation on the crystal quality of the heteroepitaxial layer. SiGe deposition on Si is a well known system to increase the lattice constant from Si to pure Ge which has a lattice constant being 4.2% larger than that of Si. Grading of the Ge concentration in the SiGe layer has been a successful way to reduce the density of TD and Pu and the surface roughness of SiGe buffer layers. Many variations of grading the Ge concentration to match the crystal lattice of Si to the intended crystal lattice constant at the surface of the graded $Si_{(1-x)}Ge_x$ buffer layer have been developed. The current quality of SiGe buffer layers requires further improvements. Especially the intensity of the cross-hatch for higher Ge concentrations is a major challenge.

Thus far, however, little attention has been given to the reactions after the deposition has ended. Typically the deposition is done by heating the substrate, e.g. a silicon wafer, to a certain temperature and then providing the components for growing a film in the gas phase (CVD, PVD, MBE etc.). When the film growth ends the film is fully or partially relaxed with regard to the substrate. Sometimes annealing steps are applied to fully relax the SiGe buffer. After the deposition is completed the cooling of the layered wafer starts. Because of the difference in thermal expansion coefficient between the heteroepitaxial layer and the substrate, a stress is generated, and the wafer bends to a certain degree resulting in a curvature of the wafer. The bowing of the wafer is a function of the film stress, the thickness of the film and the mechanical properties of the substrate. Attempts have been made to minimize the bow of the resulting SiGe/Si structure, for example by limiting the thickness of the heteroepitaxial layer and using intermediate layers within the SiGe buffer layer.

US2008/0017952 A1, which is incorporated in its entirety by reference herewith, describes a method to reduce bow caused by relaxed SiGe buffer layers by means of inserting thin strained transitional layers of silicon into the growing SiGe layer. These layers are claimed to reduce bow to a certain extent and the density of TD to less than $10^4$ cm$^{-2}$. Although this approach has some positive effect on bow, it fails in regard of reducing cross-hatch and surface-roughening.

Controlling the shape of a wafer by using front and backside layers with counteracting stress components is a well known method (US 2003/033974 A1; U.S. Pat. Nos. 4,830,984; 5,562,770; GB 2,369,490; JP 05,144727). Typically, thermally mismatched layers are deposited on the backside of a wafer in order to counteract the film stress generated by front side layers.

SUMMARY OF THE INVENTION

It is an object of the present invention to provide an appropriate solution to use stress generated by a backside layer not only for controlling the bow but for improving the quality of the SiGe epitaxial layer, in particular a reduction of cross-hatch and surface roughening of SiGe layers deposited on Si substrates. These and other objects are achieved by providing a semiconductor wafer comprising a substrate having a first side and a second side; a fully or partially relaxed SiGe heteroepitaxial layer deposited on the first side of the substrate; and a stress compensating layer deposited on the second side of the substrate. The invention preferably comprises a semiconductor wafer comprising a Si substrate having a first side and a second side; a fully or partially relaxed SiGe heteroepitaxial layer deposited on the first side of the substrate; the SiGe layer having a rms roughness within a measurement area of 40 μm×40 μm of not more than 30 nm in the center of the wafer and which differs not more than 50% from the center to the edge of the wafer; and a stress compensating layer deposited on the second side of the substrate. The invention further provides a method for producing a semiconductor wafer comprising depositing on a first side of a substrate a fully or partially relaxed SiGe heteroepitaxial layer at a deposition temperature; and before cooling the wafer from the deposition temperature, providing a stress compensating layer (SCL) on a second side of the substrate.

The stress compensating layer preferably provides a tensile stress which results in a final bow of the wafer after the deposition of the front side layer and the back side layer of not less than −27 μm and not more than +121 μm.

BRIEF DESCRIPTION OF THE DRAWINGS

Hereinafter, the invention is further explained by referring to figures.

DETAILED DESCRIPTION OF THE PREFERRED EMBODIMENTS

Figure 1:
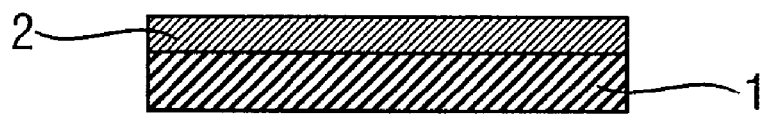
FIG. 1 represents a wafer comprising a substrate 1 and a heteroepitaxial layer 2 deposited thereon.
Figure 2:
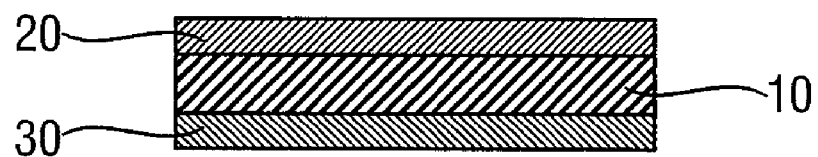
FIG. 2 represents a wafer according to the present invention. The wafer comprises a substrate 10 and a heteroepitaxial layer 20 deposited on the front side of the substrate. The wafer further comprises a stress compensating layer 30 deposited on the back side of the substrate. The stress compensating layer preferably comprises a constant composition SiGe layer having an appropriate thickness and composition for compensating the stress which is caused by the heteroepitaxial layer during cooling from the deposition temperature.
Figure 3:
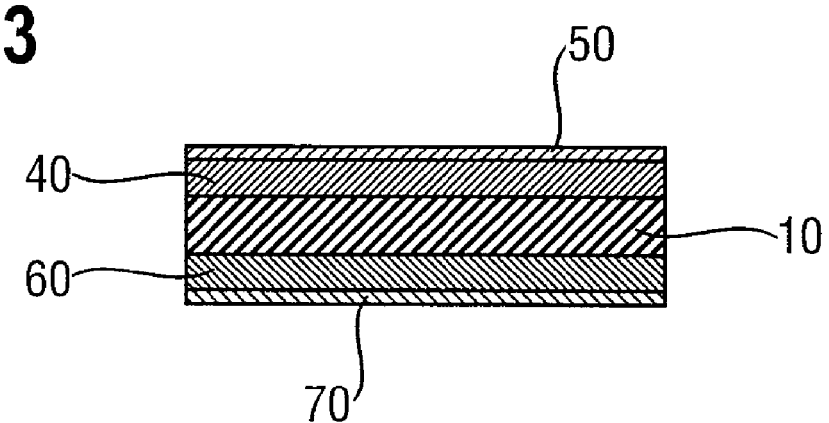
FIG. 3 represents a preferred wafer according to the present invention. The wafer comprises a substrate 10 and a heteroepitaxial layer deposited on the front side of the substrate, wherein the heteroepitaxial layer comprises a graded SiGe layer 40 deposited on the front side of the substrate and a constant composition SiGe layer 50 deposited on the graded SiGe layer. The wafer further comprises a stress compensating layer deposited on the back side of the substrate, wherein the stress compensating layer comprises a graded SiGe layer 60 deposited on the back side of the substrate and a constant composition SiGe layer 70 deposited on the graded SiGe layer.

The claimed method comprises providing a stress compensating layer ("SCL") on the backside of the substrate wafer before the wafer is cooled from a deposition temperature, after the deposition of a fully or partially relaxed buffer layer (hereinafter called "heteroepitaxial layer") on the front side of the wafer. The SCL is advantageously grown in a way to provide an appropriate amount of stress for compensating the stress generated by the heteroepitaxial layer as the wafer is cooled down from the deposition temperature. An appropriate amount of compensating stress is achieved according to one embodiment of the invention, if the thickness and the composition of the stress compensating layer corresponds to or is similar to the thickness of the heteroepitaxial layer. Similar composition means that the concentration of a component does not differ more than about 20% in the heteroepitaxial layer and the stress compensating layer. Similar thickness means that the thickness of both layers does not differ more than about 20%. An appropriate amount of compensating stress is achieved according to another embodiment of the invention, if the stress compensating layer comprises a constant composition SiGe layer and either the thickness or the composition of the constant composition SiGe layer or both are used for stress control. In principle, this approach is independent of the composition and thickness of the heteroepitaxial layer. Increasing the thickness of the constant composition SiGe layer or increasing the concentration of Ge in the constant composition SiGe layer or increasing both will increase the stress contribution of this layer for compensating the stress caused by the heteroepitaxial layer during cooling. The concentration of Ge in the constant composition SiGe layer is preferably chosen within a range of from 10 to 80 atom %.

It was unexpected that, by providing a stress compensating layer in accordance with the present invention, not only can the bow of the resulting wafer be properly controlled, but also cross-hatch and surface-roughness of the heteroepitaxial layer can be significantly reduced.

The inventors of the present invention conjecture that the provision of the stress compensating layer prevents a degradation of the heteroepitaxial layer during the phase after cooling down the wafer from the deposition temperature. After the deposition, the heteroepitaxial layer is in a fully or partially relaxed state depending on the conditions during deposition. When the film forming gases are turned off, the wafer is usually cooled down in a controlled manner. Due to the thermal mismatch of the substrate and the heteroepitaxial layer, new stress is generated because the thermal expansion coefficient of SiGe is bigger than Si the stress in the SiGe layer is tensile. This causes a set of secondary relaxation processes including the formation of secondary dislocations, roughening of the surface and also bowing of the wafer. Typically a strong increase in the density of TD and the surface roughness towards the wafer edge is observed. The claimed process providing a stress compensating layer minimizes the negative effect caused by the generation of new stress, to eliminate the center to edge non-uniformity in terms of RMS-roughness of the heteroepitaxial layer, to reduce the density of TD, to reduce the roughness of the heteroepitaxial layer caused by cross-hatch, and to control the bow of the wafer.

In the preferred embodiment of the invention, the stress compensating layer has the same or a similar composition as the heteroepitaxial layer and the same or a similar thickness as the heteroepitaxial layer.

The positive effect of the invention is demonstrated hereinafter by means of examples.

Wafers with a heteroepitaxial layer consisting of a graded SiGe layer and a constant composition SiGe layer on top of the graded SiGe layer were produced in a single wafer CVD reactor by depositing the heteroepitaxial layer on the front side of a silicon substrate wafer. The maximum concentration of germanium in the graded SiGe layer was 70%. The thickness of the graded SiGe layer was 4.6 μm. The concentration of Ge in the constant composition SiGe layer was 70%. The thickness of the constant composition SiGe layer was 1 μm. Before depositing the heteroepitaxial layer on the front side of the substrate, a stress compensating layer has been deposited on the back side of the substrate.

Several experiments were made with a constant composition $Si_{0.3}Ge_{0.7}$ layer as stress compensating layer, wherein the thickness of the layer was varied in order to reveal the stress relieving effect on the heteroepitaxial layer. With increasing thickness of the backside layer the amount of tensile stress generated is increasing. The final bow of the wafer after deposition of front side and backside layers changes with increasing backside stress from a negative bow towards a positive bow. The examples show the improvement of the SiGe front side parameters gained by applying the backside layer over a wide range of final bow. One experiment (example 4) was made with a stress compensating layer consisting of a graded SiGe layer on the substrate having a maximum concentration of germanium of 70% and a constant composition SiGe layer on top of the graded SiGe layer. The stress generated by this type of backside is between the stress from the backside in examples 3 and 5 as shown by the value of the final bow. The examples 1 to 5 show that by using stress large enough to result in a final bow of the wafer of not less than −27 μm and not more that +121 μm, the improvement of the SiGe front side layer is demonstrated.

For the purpose of comparison, two experiments were performed without providing a stress compensating layer before cooling the wafer from the deposition temperature. According to the first comparative example, a graded SiGe layer and a constant composition layer identical to the front side layer of the examples was deposited on a silicon substrate wafer. The maximum concentration of germanium in the graded layer was 70%. The second comparative example was performed in accordance with the first comparative example, differing only in that 11 strained transitional layers of silicon as taught in US2008/0017952 A1 were provided within the graded SiGe layer for reducing the bow of the resulting wafer. The thickness of each transitional layer was 7 nm.

Further details of the experiments and the results in regard of the reduction of bow, warp, TDD and RMS-roughness are displayed in the following table. The deposition gas for depositing the stress compensating layer and the heteroepitaxial layer was a mixture of $SiCl_2H_2$ and $GeCl_4$ in hydrogen as a carrier gas.

The density of TD was measured by microscopic inspection after Secco etching. RMS-roughness was measured with an atomic force microscope (40×40 μm). Warp analysis was made by using an AFS type device from ADE Corp. USA.

TABLE

|  | Comp. Example 1 | Comp. Example 2 | Example 1 | Example 2 | Example 3 | Example 4 | Example 5 |
|---|---|---|---|---|---|---|---|
| grade rate | 20%/μm | 20%/μm | 20%/μm | 20%/μm | 20%/μm | 20%/μm | 20%/μm |
| deposition temperature before cooling | 1000° C. | 1050° C. | 1000° C. | 1000° C. | 1000° C. | 1000° C. | 1000° C. |
| thickness of the stress compensating layer | | | 2.01 μm | 2.51 μm | 3.01 μm | 5.6 μm | 4.82 μm |
| TDD (center) | $8 \cdot 10^5/cm^2$ | $5.0 \cdot 10^6/cm^2$ | $4.8 \cdot 10^5/cm^2$ | $4.0 \cdot 10^5/cm^2$ | $4.3 \cdot 10^5/cm^2$ | $6.3 \cdot 10^5/cm^2$ | $6.2 \cdot 10^5/cm^2$ |
| TDD (edge) | $8.7 \cdot 10^5/cm^2$ | $>1 \cdot 10^7/cm^2$ | $6.1 \cdot 10^5/cm^2$ | $6.3 \cdot 10^5/cm^2$ | $6.4 \cdot 10^5/cm^2$ | $6.3 \cdot 10^5/cm^2$ | $6.9 \cdot 10^5/cm^2$ |
| RMS-roughness (center) | 36.4 nm | 81.6 nm | 30 nm | 27 nm | 23.1 nm | 25.1 nm | 27.7 nm |
| RMS-roughness (edge) | 150.4 nm | 186.1 nm | 37.9 nm | 33.5 nm | 57.3 nm | 43.7 nm | 41.5 nm |
| Bow | −157 μm | −65 μm | −27 μm | 2 μm | 37 μm | 54 μm | 121 μm |
| Warp | 290 μm | 132 μm | 56 μm | 32 μm | 96 μm | 125 μm | 274 μm |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A multilayer semiconductor wafer comprising
   a silicon substrate wafer having a first side and a second side;
   a fully or partially relaxed graded SiGe heteroepitaxial layer deposited on the first side of the substrate wafer and a constant composition SiGe layer on top of the graded SiGe heteroepitaxial layer; and
   a constant composition SiGe layer deposited on the second side of the substrate wafer acting as a stress compensating layer.

2. The wafer of claim 1, wherein the concentration of Ge in the constant composition SiGe layer acting as the stress compensating layer is from 10 to 80%.

* * * * *